(12) United States Patent
Faveluke et al.

(10) Patent No.: US 6,469,907 B1
(45) Date of Patent: Oct. 22, 2002

(54) PACKAGING FOR POWER AND OTHER CIRCUITRY

(75) Inventors: Alex Faveluke, Portland, OR (US); Walt Noll, Cottage Grove, OR (US)

(73) Assignee: Team Pacific, Corporation, Metro Manilla (PH)

(*) Notice: Subject to any disclaimer, the term of this patent is extended or adjusted under 35 U.S.C. 154(b) by 0 days.

(21) Appl. No.: 09/694,540

(22) Filed: Oct. 23, 2000

(51) Int. Cl.[7] .............................. H05K 7/02; H05K 7/10
(52) U.S. Cl. .................... 361/760; 361/749; 361/777; 361/776; 174/35 R; 174/51; 174/254
(58) Field of Search ................................ 361/760, 749, 361/784, 772, 776, 777, 803, 728, 752; 174/35 R, 51 R, 254, 261

(56) References Cited

U.S. PATENT DOCUMENTS

| | | | |
|---|---|---|---|
| 3,833,837 A | * 9/1974 | West | ............................ 361/694 |
| 4,278,991 A | 7/1981 | Ritchie et al. | |
| 4,589,010 A | 5/1986 | Tateno et al. | |
| 4,630,174 A | 12/1986 | Kaufman | |
| 4,819,042 A | 4/1989 | Kaufman | |
| 4,949,220 A | 8/1990 | Tashiro | |
| 5,127,570 A | * 7/1992 | Steitz et al. | ................. 174/254 |
| 5,404,273 A | 4/1995 | Akagawa | |
| 5,428,190 A | * 6/1995 | Stopperan | .................... 174/261 |
| 5,438,021 A | 8/1995 | Tagawa et al. | |
| 5,572,407 A | 11/1996 | Sobhani | |
| 5,703,399 A | 12/1997 | Majumdar et al. | |
| 5,739,586 A | 4/1998 | Cannizzaro et al. | |
| 5,835,350 A | 11/1998 | Stevens | |
| 5,877,937 A | 3/1999 | Shibata et al. | |
| 5,926,373 A | 7/1999 | Stevens | |
| 5,986,885 A | 11/1999 | Wyland | |
| 6,002,589 A | 12/1999 | Perino et al. | |
| 6,069,408 A | 5/2000 | Honda et al. | |
| 6,101,089 A | * 8/2000 | Seto et al. | ................... 361/687 |

* cited by examiner

Primary Examiner—David Martin
Assistant Examiner—Hung Bui
(74) Attorney, Agent, or Firm—Birdwell, Janke & Durando, PLC

(57) ABSTRACT

Packaging for power circuitry. A circuit board and a power lead frame are packaged together in a module. In addition to providing electrical connections to power circuitry, the lead frame is employed to fix or partially fix the location of the circuit board in the package. For this purpose, one of the power lead frame and the circuit board includes a male portion and the other of the power lead frame and the circuit board includes a complementary female portion for mechanically coupling the circuit board and the lead frame.

20 Claims, 2 Drawing Sheets

PACKAGING FOR POWER AND OTHER CIRCUITRY

BACKGROUND OF THE INVENTION

The present invention relates to packaging for power and other circuitry, such as power semiconductor devices and associated circuitry.

Packaging for power circuitry must solve a number of mechanical and electrical problems. As examples of mechanical considerations, the package must provide for conducting heat away from power dissipating devices, for sealing the devices from the environment to protect the devices, and for reliably mounting the devices with respect to one another both mechanically and electrically. Electrically, the package must provide for high current carrying capability, high voltage isolation and low inductance connections. Moreover, it is desirable to integrate as much of the associated circuitry required to drive, control or protect the power semiconductor devices as possible in a single package, imposing further requirements on the packaging.

There have been a number of approaches taken to packaging power circuitry. Typically, a rigid substrate such as metal or ceramic is provided as a base. Where ceramic is employed, it may be of a type that is thermally conductive. Where metal is employed, an insulating layer is applied over the metal (known in the art as "insulated metal substrate" or "IMS"). As in standard printed circuit board construction, a layer of copper is plated over the ceramic or insulating layer and etched to form traces and pads for bonding and connecting power devices, such as bipolar junction transistors, field effect transistors, insulated gate bipolar junction transistors ("IGBTs"), diodes or silicon controlled rectifiers ("SCRs"). Power devices are soldered to the pads, and wires are bonded to the pads to make additional electrical connections.

Leads are provided to extend from the package and are wire bonded or soldered to the power devices. A "lead frame" may be used for this purpose, which is typically an assembly of nickel plated copper. The entire package is typically finally encapsulated in a plastic resin.

It is often desirable to provide a driver, control or protection circuit (hereinafter "control circuit") in a module of one or more power devices for driving the devices. This provides a higher level of integration, which leads to economies in production. Moreover, it is desirable to place the control for the power devices as close as possible to the power devices to minimize the inductance of the conductive lengths of wire or traces therebetween.

The control circuit is typically formed on a standard printed circuit board. To mount the printed circuit board to the base, header pins are oriented vertically and soldered to pads on the base to make physical connection thereto. Holes are provided in the printed circuit board to align with and receive the header pins as the board is placed over the base. The header pins are then soldered to the circuit board. Additional hardware, such as stand-offs and screws, are used to fix the mounting. The stand-offs and the header pins in combination provide mechanical support for the circuit board, while electrical connection between the circuit board and the power devices below is typically made through the header pins wherein additional connections may be made by wires.

A problem with this approach is that solder connections are both weak and brittle. The circuit board may break free from its mounting during assembly or during the encapsulation process, which risks breaking the electrical connection between the controller and the power devices. Moreover, during use, thermal expansion and contraction of the module stresses the joints and may ultimately cause failure.

Another problem with this approach is that the header pins are relatively large, so that the header pins and the holes required therefor in the circuit board consume valuable space on the circuit board, and contribute to increasing the size of the module as a whole.

Both the space required by the header pins and stand-offs and the brittleness of the solder connection of the header pins compound the difficulty of encapsulating the package. Transfer molding is typically used for packaging DIPs, discrete transistors, SOICs, and other smaller integrated circuits, because it has a number of advantages. It does not require that the device to be packaged have a separate enclosure to receive a resin material, it is fast, the high heat and pressure applied reduce the tendency to form voids and retain moisture in the package, and it provides a strong, rigid assembly that prevents the wires or leads inside the package from moving and, therefore, from being strained during power cycling and during use.

However, transfer molding has been limited to use in relatively small packages, primarily because of the increased propensity to form voids as the package becomes larger. Another problem with using transfer molding for larger packages is that the integrated circuits and wires in the package will in general reach a higher temperature and retain that higher temperature for a longer period of time during molding due to the reduced surface area of the package relative to its volume. Very high temperatures may stress the integrated circuits and melt the solder connections. Prior art power modules that include an auxiliary circuit board have not heretofore been small enough to take advantage of the advantages afforded by the transfer molding process.

Accordingly, there is a need for packaging for power and other circuitry that provides for interconnecting a circuit board and power devices mounted separately from the circuit board in an integrated power circuit more reliably and at lower cost, and that provides for minimizing the size of the package, and that provides for the use of transfer molding to encapsulate the package.

SUMMARY OF THE INVENTION

The packaging for power and other circuitry of the present invention solves the aforementioned problems and meets the aforementioned needs by providing a circuit board for mounting control circuitry and a power lead frame for mounting power circuitry. In addition to providing electrical connections to power circuitry, the lead frame is employed to fix or partially fix the location of the circuit board in the package. For this purpose, one of the power lead frame and the circuit board includes a male portion and the other of the power lead frame and the circuit board includes a complementary female portion for mechanically coupling the circuit board and the lead frame.

In a preferred embodiment of the invention, the lead legs include respective apertures for receiving corresponding tabs of the circuit board. The lead legs bend elastically to provide clearance for the tabs and elastically relax to capture the tabs in the apertures once these features mate.

In another aspect of the invention, a length of flexible material supporting electrically conductive traces is provided to electrically connect the printed circuit board to the power lead frame or to the power devices directly.

In yet another aspect of the invention, the flexible material is relieved on one or both sides to provide access to the traces for welding the traces to the lead frame.

Therefore, it is a principal object of the present invention to provide a novel and improved packaging for power and other circuitry.

It is another object of the present invention to provide packaging for power and other circuitry that provides for decreasing the cost of combining a printed circuit board and power devices in the same package.

It is yet another object of the present invention to provide packaging for power and other circuitry that provides for increasing the reliability of the electrical connection between circuitry mounted on one substrate and circuitry mounted on another, separate substrate.

It is still another object of the present invention to provide packaging for power and other circuitry that provides for increasing the reliability of the mechanical connection between a circuit board and another, separate substrate.

It is a further object of the present invention to provide packaging for power and other circuitry that provides for decreasing the manufacturing cost of providing a mechanical connection between a circuit board and another, separate substrate.

It is still a further object of the present invention to provide packaging for power and other circuitry that provides for flexibly mounting a circuit board to a rigid substrate.

It is yet a further object of the present invention to provide packaging for power and other circuitry that provides for more inexpensively electrically connecting a flexible connection to a substrate.

It is another object of the present invention to provide packaging for power and other circuitry that provides for decreasing the area required by the circuitry.

It is still another object of the present invention to provide packaging for power and other circuitry that provides for decreasing the overall size of the package.

It is yet another object of the present invention to provide packaging for power and other circuitry that provides for the use of transfer molding to encapsulate the package.

The foregoing and other objects, features and advantages of the present invention will be more readily understood upon consideration of the following detailed description of the invention, taken in conjunction with the following drawings.

DETAILED DESCRIPTION OF A PREFERRED EMBODIMENT

Figure 1:
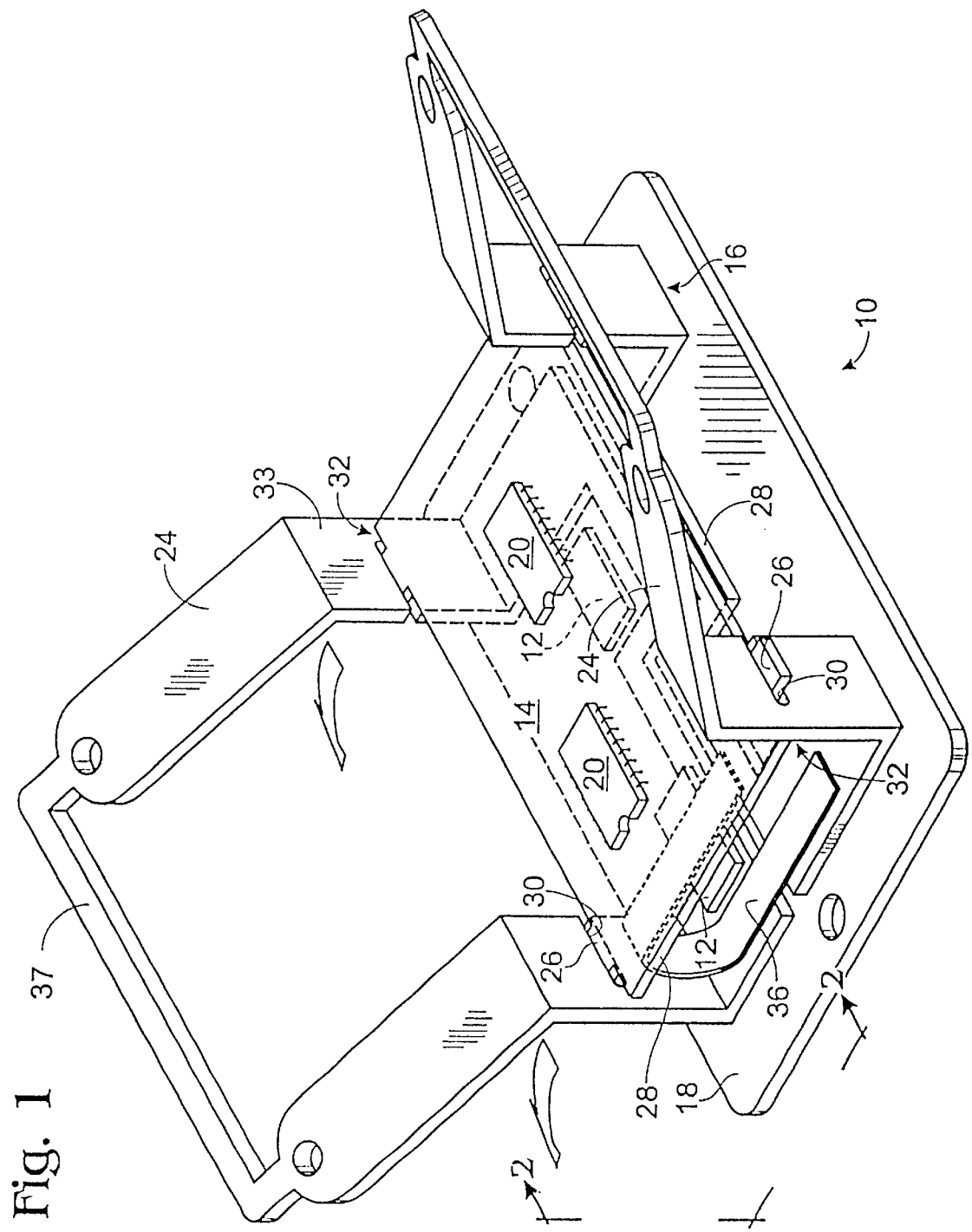
FIG. 1 is a pictorial view of a preferred embodiment of packaging for power and other circuitry according to the present invention in a first stage of assembly.

Referring to FIG. 1, a preferred embodiment of packaging 10 for power circuitry 12 according to the present invention includes a circuit board 14 and a power lead frame 16 on which is mounted the power circuitry 12.

The power circuitry 12 is typically one or more high power semiconductor devices, such as BJT, FET or IGBT dice. The relevant characteristic of the power circuitry for purposes of the present invention is that, because the circuitry dissipates relatively high power, it is desirable to provide a relatively highly thermally conductive substrate for mounting the power circuitry. This substrate is typically a thermally conductive base 18 on which is mounted the lead frame 16. However, the power lead frame is also thermally conductive and, at least conceptually for purposes herein, the base is not essential. Typically, the power lead frame and the base are both formed of nickel plated copper, and where a base is provided, it is preferably soldered to a metallized ceramic which in turn is soldered to the lead frame. The ceramic provides for electrical isolation and is particularly adapted to provide a high thermal conductivity.

The circuit board 14 is provided for mounting electrical components 20 that dissipate relatively low power, such as driver, control or protection circuitry. Therefore, the circuit board is not required to be highly thermally conductive and it may accordingly be provided relatively inexpensively. Typically, the circuit board 14 is formed of etched layers of copper on corresponding layers of fiberglass reinforced epoxy as is standard practice in the art.

In addition to providing relatively high thermal conductivity, the power lead frame provides power lead legs 24 that are electrically connected to the circuitry 12 and extend outside the packaging 10 to provide access for making electrical connection to the circuitry 12 by the user. The power lead legs are held together during manufacturing by a break-away bar 37 that is severed after final assembly (compare FIGS. 1 and 2). Similarly, a control signal lead frame (not shown) is 15 soldered to associated pads on the circuit board 14 to provide signal lead legs that extend from the packaging 10 and provide access for making electrical connection to the circuitry 20; however, the control signal lead frame has no particular pertinence to the present invention and will not be further discussed.

According to the invention, the power lead legs 24 serve the additional purpose of capturing, or assisting to capture, the circuit board 14; thereby locating, or assisting to locate, the circuit board relative to the power circuitry 12. The power lead legs 24 are somewhat flexible and may be bent elastically, within limits, as is typical for metals as well as many other materials. This property of the legs 24 is employed along with male and female connecting features in the circuit board and legs such as described below.

Figure 2:
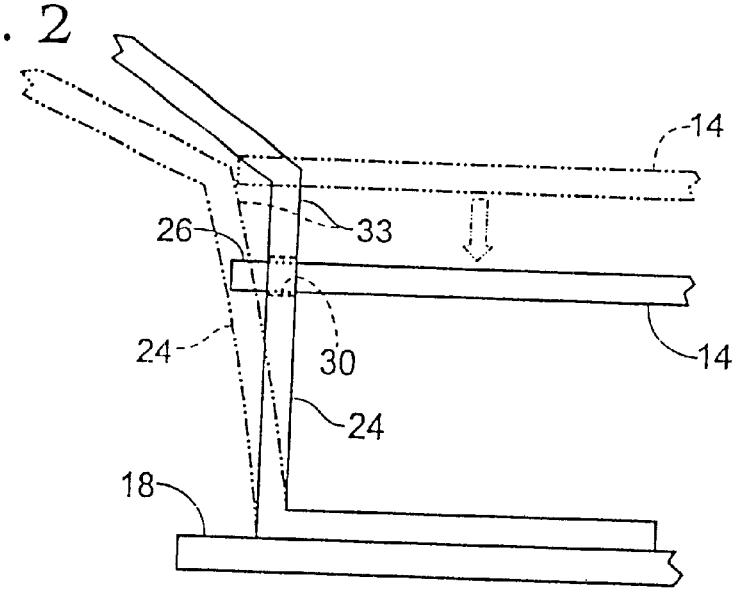
FIG. 2 is a partial side elevation of the packaging of FIG. 1, taken along the line 2—2.

In the preferred embodiment of the invention, the circuit board 14 carries the male connecting features, provided in the form of tabs 26 extending outwardly from the outer perimeter 28 of the circuit board. Legs 24 associated with the tabs 26 carry the female connecting features, which are provided in the form of notches 30 corresponding to the tabs 26. A "snap" fit is provided by positioning the legs 24 so that the tabs slide downwardly on the legs, along surfaces 33 of the legs, bending the legs in the direction of the arrows until the tabs reach the notches, whereupon the legs elastically return to position to capture the tabs therein. This sequence of events is also shown in FIG. 2.

Preferably, a leg and corresponding tab is provided at each of four corners 32 of the circuit board 14; however, it is not essential to provide any particular number and location of the connecting features to provide some benefit according to the invention. Moreover, the connecting features may be employed in concert with standard means for fixing the location of a circuit board with respect to another substrate, or in concert with any mounting or attachment means known to those of ordinary mechanical skill, without departing from the principles of the invention. As will be immediately apparent to such persons, any number of male and female connecting features may be employed, and each type of feature may be provided on either the circuit board 12 or the lead legs 24.

The circuit board 14 may be electrically interconnected with the power circuitry 12 directly, or indirectly through the power lead frame, by standard means such as the use of header pins. However, according to another aspect of the invention, a flexible interconnection 36 is provided for this purpose. The flexible interconnection is readily commercially available in the form of a flexible polyimide substrate with metal traces and pads similar to the circuit board 14 (commonly referred to as a "flex circuit"). The flexible interconnection 36 between the circuit board and the power lead frame facilitates the aforedescribed snap fitting of these parts together, as well as provides improved access to the board 14 and its components 20 for test and repair. The circuit board 14 and the flexible interconnection 36 may also be combined in what is known in the art as a "flex rigid assembly."

Figure 3:
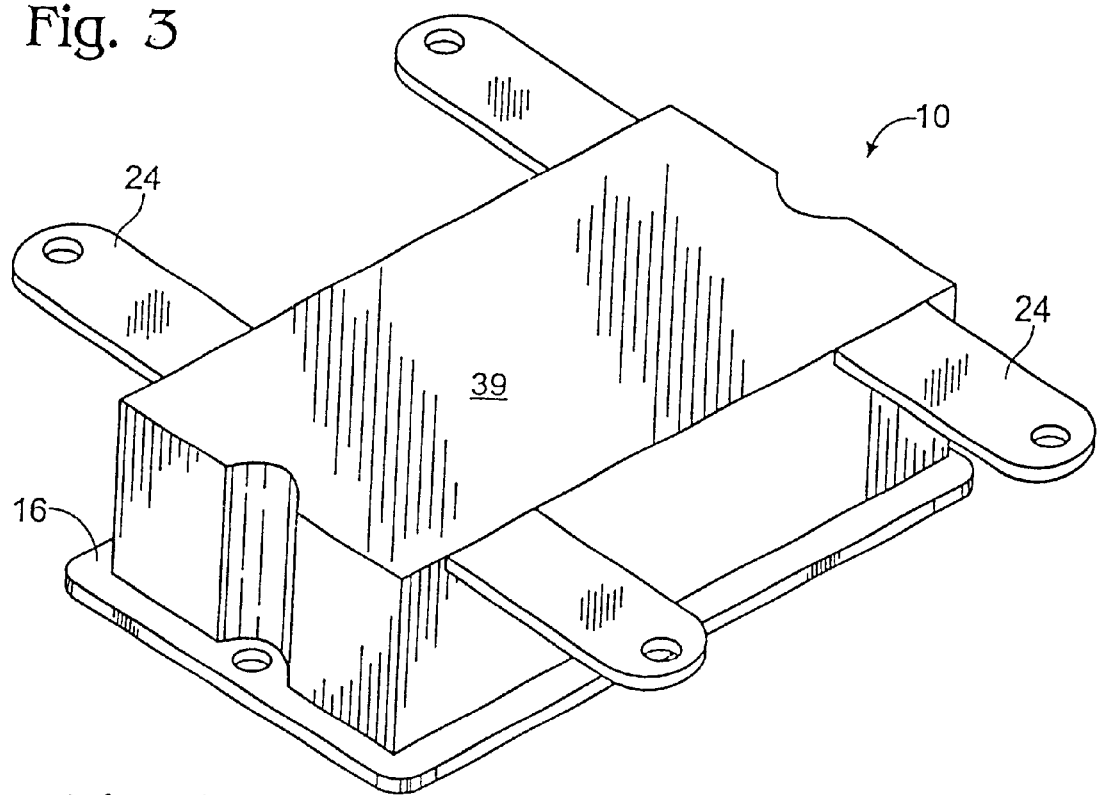
FIG. 3 is a pictorial view of the packaging of FIG. 1 in a completed stage of assembly.

Referring to FIG. 3, once the circuit board 14 is properly positioned, the packaging 10 is encapsulated in a plastic resin 39. Prior art power modules are usually potted in epoxy or silicone. Preferably, however, encapsulation of the packaging 10 is accomplished by transfer molding which, as noted above, provides for increased manufacturing economy while producing a package having superior mechanical properties. Because the present invention eliminates some of the space required in the packaging 10 to locate the circuit board 14 therein, transfer molding becomes a viable encapsulation option, and this is considered an outstanding advantage of the invention. However, it is not essential to the invention to encapsulate the package using transfer molding, or even to encapsulate the package at all.

Figure 4:
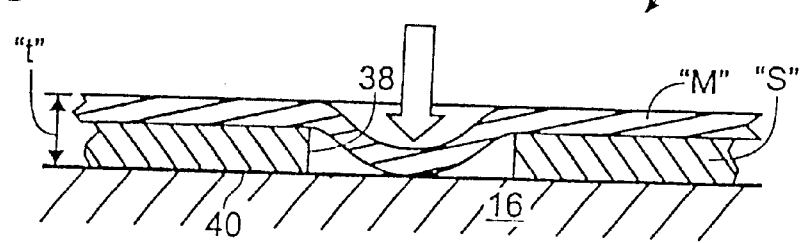
FIG. 4 is a side elevation of a flexible circuit, showing a method for making electrical connection to a lead frame according to the present invention.

In one embodiment of the invention, the flexible interconnection 36 is mechanically attached to the lead frame by a double-sided adhesive tape. This has been found to provide generally satisfactory results; however, the tape may not reliably stand up to the heat to which the packaging 10 is exposed during the encapsulation. Therefore, in another aspect of the invention, the flexible interconnection may be provided in a form known in the art as "back bared." Referring to FIG. 4, a flex circuit or flex rigid assembly may be provided so that apertures 38 that extend through the substrate "S," but not through the metal layer "M" which defines the traces and pads of the interconnection. The apertures are sufficiently large relative to the thickness "t" of the circuit that the metal layer may be deformed to make contact with a surface that is co-planar with the bottom surface 40 of the circuit without rupturing. Thence, the circuit may be laid on top of the power lead frame 16, and the metal of the flexible circuit that is located over or under the aperture may be pressed against the power lead frame in the direction of the arrow. To form an electromechanical bond, an electric current may be passed through the metal layer and the lead frames or electromagnetic or ultrasonic acoustic waves may be applied to or directed at the metal layer or the lead frame to weld the metal to the lead frame.

It is to be recognized that, while particular packaging for power and other circuitry has been shown and described as preferred, other configurations and methods could be utilized, in addition to those already mentioned, without departing from the principles of the invention.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

What is claimed is:

1. A package for one or more first electrical components having relatively low power dissipation and one or more second electrical components having relatively high power dissipation, comprising:

a circuit board for mounting the first electrical components;

a lead frame for mounting the second electrical components, said lead frame having at least one lead leg for electrically connecting to least one of the second electrical components, wherein one of said lead frame and said circuit board has a male portion and the other of said lead frame and said circuit board has a complementary female portion for receiving said male portion and thereby mechanically coupling said circuit board to said lead frame; and a flexible interconnection for electrically connecting at least one of said circuit board and the first electrical components to at least one of said lead frame and the second electrical components.

2. The package of claim 1, wherein one of said lead leg and said circuit board has said male portion and the other of said lead leg and said circuit board has said female portion.

3. The package of claim 2, wherein said circuit board has an outer perimeter and said male portion includes a tab extending past said outer perimeter, and wherein said female portion includes a notch in said lead leg that is adapted to receive said tab.

4. The package of claim 1, further comprising a base that is relatively thermally conductive as compared to said circuit board, wherein said lead frame is mounted on said base.

5. The package of claim 4, wherein said lead frame is mounted on said base with a first electrical connection between said lead frame and a ceramic material and a second electrical connection between said ceramic material and said base.

6. The package of claim 1, wherein said electrical connection mechanism comprises a substrate that is relatively flexible compared to said circuit board having one or more electrically conductive traces.

7. The package of claim 6, wherein at least one of said traces is electrically connected to said lead frame.

8. The package of claim 7, wherein said at least one of said traces is electrically connected to said lead frame by welding.

9. The package of claim 8, wherein said substrate has an aperture under said at least one of said traces to facilitate said welding.

10. The package of claim 1, further comprising an encapsulating material substantially surrounding said circuit board and said flexible interconnection.

11. A method for packaging one or more first electrical components having relatively high power dissipation and one or more second electrical components having relatively low power dissipation, comprising:

providing a circuit board for mounting the first electrical components;

providing a lead frame, said lead frame having at least one lead leg;

mounting the second electrical components onto said lead frame;

electrically connecting said at least one lead leg to at least one of the second electrical components;

mechanically coupling said circuit board to said lead leg; and electrically connecting at least one of said circuit board and the first electrical components to at least one of said lead frame and the second electrical components.

12. The method of claim 11, wherein said step of mechanically coupling said circuit board to said lead leg is by providing in one of said circuit board and said lead leg a male portion and providing in the other of said circuit board and said lead leg a complementary female portion, and mating said male portion and said female portion.

13. The method of claim 11, wherein said step of electrically connecting at least one of said circuit board and the first electrical components is with a flexible interconnection.

14. The method of claim 13, wherein said step of mechanically coupling said circuit board to said lead leg is by providing in one of said circuit board and said lead leg a male portion and providing in the other of said circuit board and said lead leg a complementary female portion, and mating said male portion and said female portion.

15. The method of claim 14, wherein said step of mechanically coupling said circuit board to said lead frame includes elastically deforming said lead frame to permit said step of mating.

16. The method of claim 15, wherein said step of mechanically coupling said circuit board to said lead frame includes sliding said circuit board on said lead leg thereby elastically deforming said lead leg until said male and female portions mate.

17. The method of claim 16, further comprising elastically relaxing said lead frame when said male and female portions mate to capture said male and female portions together.

18. The method of claim 11, further comprising encapsulating said circuit board and said flexible interconnection by transfer molding.

19. The package of claim 2, wherein said lead frame includes an opposing lead leg compliantly disposed with respect to said one lead leg so that said one lead leg and said opposite lead leg may be relatively spread apart from one another a first distance over which deformation of said lead legs is substantially elastic, wherein one of said opposing lead leg and said circuit board has another male portion and the other of said opposing lead leg and said circuit board has another female portion for receiving said other male portion, and wherein said circuit board is adapted to fit between said one lead leg and said opposing lead leg according to two conditions, wherein in said first condition with said circuit board being disposed between said lead legs so that said male portion does not extend through said female portion, said one lead leg and said opposing lead leg must be spread apart from one another said first distance and a first stress is consequently applied to said circuit board thereby, and wherein in said second condition with said circuit board being disposed between said lead legs so that said male portion extends through said female portion and said other male portion extends through said other female portion, said one lead leg and said opposing lead leg are spread apart from one another a second distance and a second stress is consequently applied to said circuit board thereby, wherein said second stress is substantially less than said first stress.

20. The package of claim 19, wherein, according to said second condition, said second stress is substantially zero.

* * * * *